(12) United States Patent
Yoshino et al.

(10) Patent No.: US 8,889,040 B2
(45) Date of Patent: *Nov. 18, 2014

(54) CONDUCTIVE PASTE COMPOSITION FOR SOLAR CELL

(75) Inventors: Yasushi Yoshino, Nagoya (JP); Yusuke Kawamoto, Nagoya (JP)

(73) Assignee: Noritake Co., Limited, Nagoya-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/806,239

(22) PCT Filed: Jun. 17, 2011

(86) PCT No.: PCT/JP2011/063969
§ 371 (c)(1),
(2), (4) Date: Dec. 21, 2012

(87) PCT Pub. No.: WO2012/002182
PCT Pub. Date: Jan. 5, 2012

(65) Prior Publication Data
US 2013/0099181 A1    Apr. 25, 2013

(30) Foreign Application Priority Data

Jul. 2, 2010   (JP) .................................. 2010-152205

(51) Int. Cl.
| | |
|---|---|
| *H01B 1/16* | (2006.01) |
| *H01B 1/22* | (2006.01) |
| *C03C 8/10* | (2006.01) |
| *C03C 8/18* | (2006.01) |
| *H01L 31/0224* | (2006.01) |

(52) U.S. Cl.
CPC .............. *H01L 31/0224* (2013.01); *C03C 8/10* (2013.01); *C03C 8/18* (2013.01); *Y02E 10/50* (2013.01); *H01L 31/022425* (2013.01); *H01B 1/22* (2013.01)
USPC ......................... 252/512; 106/1.14

(58) Field of Classification Search
CPC .............. H01B 1/16; H01B 1/22; C09D 5/24; C03C 3/00; C03C 4/14; C03C 12/00; C03C 14/006; H05K 1/0296; H05K 1/092; H01L 23/49883
USPC .................................. 252/512–514; 106/1.14
See application file for complete search history.

(56) References Cited

U.S. PATENT DOCUMENTS

| | | |
|---|---|---|
| 4,256,513 A | 3/1981 | Yoshida et al. |
| 4,737,197 A | 4/1988 | Nagahara et al. |

(Continued)

FOREIGN PATENT DOCUMENTS

| | | |
|---|---|---|
| CN | 1881621 A | 12/2006 |
| JP | A-55-103775 | 8/1980 |

(Continued)

OTHER PUBLICATIONS

International Preliminary Report on Patentability issued in International Application No. PCT/JP2010/065072 dated Apr. 11, 2012.

(Continued)

*Primary Examiner* — Mark Kopec
(74) *Attorney, Agent, or Firm* — Oliff PLC

(57) ABSTRACT

A conductive paste composition for a solar cell includes a conductive powder, a glass frit, and a vehicle, the glass frit consisting of glass containing 0.6 to 18.0 (mol %) $Li_2O$, at least one of 0.1 to 6.0 (mol %) $P_2O_5$ and 0.1 to 4.0 (mol %) $Sb_2O_5$, 20 to 62 (mol %) PbO, 1 to 18 (mol %) $B_2O_3$, 18 to 65 (mol %) $SiO_2$, 0 to 6 (mol %) $Al_2O_3$, 0 to 6 (mol %) $TiO_2$, and 0 to 30 (mol %) ZnO in oxide conversion, the glass having a ratio of Pb/Si (mol ratio) within a range of 0.5 to 1.7.

3 Claims, 1 Drawing Sheet

(56) References Cited

U.S. PATENT DOCUMENTS

| | | | |
|---|---|---|---|
| 5,338,708 A * | 8/1994 | Felten ............................ 501/19 |
| 5,363,271 A * | 11/1994 | Pepin ............................ 361/320 |
| 5,661,041 A | 8/1997 | Kano |
| 5,670,089 A * | 9/1997 | Oba et al. ...................... 252/514 |
| 7,462,304 B2 | 12/2008 | Wang et al. |
| 7,556,748 B2 | 7/2009 | Wang et al. |
| 2006/0102228 A1 | 5/2006 | Sridharan et al. |
| 2006/0272700 A1 | 12/2006 | Young et al. |
| 2010/0096598 A1 | 4/2010 | Sridharan et al. |
| 2012/0168691 A1 | 7/2012 | Yoshino et al. |

FOREIGN PATENT DOCUMENTS

| | | |
|---|---|---|
| JP | A-59-168667 | 9/1984 |
| JP | B2-62-28597 | 6/1987 |
| JP | B2-3-46985 | 7/1991 |
| JP | B2-3-50064 | 7/1991 |
| JP | A-06-093307 | 4/1994 |
| JP | A-08-148446 | 6/1996 |
| JP | A-10-012043 | 1/1998 |
| JP | A-11-213754 | 8/1999 |
| JP | B2-3050064 | 6/2000 |
| JP | B2-3707715 | 10/2005 |
| JP | A-2006-302890 | 11/2006 |
| JP | A-2006-302891 | 11/2006 |
| JP | A-2008-520094 | 6/2008 |
| JP | A-2009-099781 | 5/2009 |
| JP | A-2009-194121 | 8/2009 |
| WO | WO 2006/055126 A2 | 5/2006 |
| WO | WO 2009/134646 A1 | 11/2009 |

OTHER PUBLICATIONS

Nov. 2, 2012 Office Action issued in Chinese Patent Application No. 201080041275.X (with translation).
Jul. 1, 2013 Office Action issued in Chinese Patent Application No. 201080041275.X (with partial translation).
Dec. 9, 2013 Office Action issued in U.S. Appl. No. 13/395,814.
Feb. 12, 2013 International Preliminary Report on Patentability issued in International Application No. PCT/JP2011/063969.

\* cited by examiner

CONDUCTIVE PASTE COMPOSITION FOR SOLAR CELL

TECHNICAL FIELD

The present invention relates to a conductive paste composition preferred for a solar cell electrode formed with a fire-through method.

BACKGROUND ART

For example, a typical silicon-based solar cell has a configuration including an antireflection film and a light-receiving surface electrode via an $n^+$ layer on an upper surface of a silicon substrate that is a p-type polycrystalline semiconductor and including a back surface electrode (hereinafter simply "electrode" when no distinction is made between these electrodes) via a $p^+$ layer on a lower surface, and electric power generated by receiving light in p-n junction of the semiconductor is extracted through the electrodes. The antireflection film is for the purpose of reducing a surface reflectance while maintaining a sufficient visible light transmittance to increase light reception efficiency and is made up of a thin film of silicon nitride, titanium dioxide, silicon dioxide, etc.

The antireflection film has a high electric resistance value and therefore prevents efficient extraction of electric power generated in the p-n junction of the semiconductor. Therefore, the light-receiving surface electrode of the solar cell is formed with a method called fire-through, for example. In this electrode forming method, for example, after the antireflection film is disposed on the entire surface of the $n^+$ layer, a conductive paste is applied in an appropriate shape onto the antireflection film by using a screen printing method, for example, and is subjected to firing treatment. The conductive paste consists mainly of, for example, silver powder, glass frit (flaky or powdery fragments of glass formed by melting, quenching, and, if needed, crushing glass raw materials), an organic vehicle, and an organic solvent and, since a glass component in the conductive paste breaks the antireflection film in the course of the firing, the ohmic contact is formed between the conductive component in the conductive paste and the $n^+$ layer (see, e.g., Patent Document 1). This electrode forming method simplifies the operation as compared to the case of partially removing the antireflection film to form an electrode in the removed portion and causes no problem of displacement between the removed portion and the electrode forming position.

Various proposals have hitherto been made in such a solar cell light-receiving surface electrode formation for a purpose such as enhancing the fire-through property to improve the ohmic contact and consequently increasing a fill factor (FF) and energy conversion efficiency. For example, the group five elements such as phosphorus, vanadium, and bismuth are added to the conductive paste to promote the oxidation-reduction effect of glass and silver to the antireflection film, improving the fire-through property (see, e.g., Patent Document 1 above). Chloride, bromide, or fluoride is added to the conductive paste to assist the effect of glass and silver breaking the antireflection film with these additives, improving the ohmic contact (see, e.g., Patent Document 2). The glass is borosilicate glass, for example.

It is proposed to include 0.5 to 5 parts by weight of silver phosphate per 100 parts by weight of silver powder into the conductive paste so as to assist the effect of breaking the antireflection film and ensure the ohmic contact (see, e.g., Patent Document 3). It is described that when glass containing zinc oxide as a major component without containing lead is used for forming a paste containing silver, gold, and antimony, the breakage of conjunction does not occur because of the absence of penetration of an electrode, thereby ensuring a low contact resistance (see, e.g., Patent Document 4). It is also proposed for a silver-containing paste containing 85 to 99 (wt %) silver and 1 to 15 (wt %) glass that the glass has a composition containing 15 to 75 (mol %) PbO and 5 to 50 (mol %) $SiO_2$ and not containing $B_2O_3$ (see, e.g., Patent Document 5). This silver-containing paste is used for the solar cell electrode formation and the ohmic contact is considered to be improved by using the glass having the composition described above. The glass can contain 0.1 to 8.0 (mol %) $P_2O_5$ or 0.1 to 10.0 (mol %) $Sb_2O_5$ and can further contain 0.1 to 15.0 (mol %) alkali metal oxide ($Na_2O$, $K_2O$, Li—$_2O$).

PRIOR ART DOCUMENTS

Patent Documents

Patent Document 1: Japanese Examined Patent Application Publication No. 03-046985
Patent Document 2: Japanese Patent Publication No. 3707715
Patent Document 3: Japanese Patent Publication No. 3050064
Patent Document 4: Japanese Examined Patent Application Publication No. 62-028597
Patent Document 5: Japanese Unexamined Patent Application Publication (Translation of PCT Application) No. 2008-520094

SUMMARY OF THE INVENTION

Problem to be Solved by the Invention

It is attempted in the solar cell to reduce the thickness of an n layer located on the light-receiving side to lower a surface recombination rate such that more electric current is extracted, i.e., to form a shallow emitter. The formation of the shallow emitter causes the short wavelength side, particularly, in the vicinity of 400 (nm), to contribute to electric generation and, therefore, this is considered as an ideal solution in terms of improvement in efficiency of a solar cell. On the other hand, it is disadvantageous that a cell must have higher sheet resistance, that the reduction in concentration of a donor element (e.g., phosphorus) in the vicinity of a surface increases a barrier between Ag and Si and makes it difficult to ensure an ohmic contact of a light-receiving surface electrode, and that the reduction in thickness of the pn junction makes it very difficult to sufficiently break an antireflection film with fire-through while a penetration depth is controlled to prevent an electrode from penetrating into the pn junction.

Since the shallow emitter has a thinner n layer thickness of 70 to 100 (nm) on the light-receiving side as compared to 100 to 200 (nm) of a conventional silicon solar cell and reduces a portion of electricity generated by receiving light unable to be efficiently utilized because of conversion into heat before reaching the pn junction, short-circuit current is increased and, consequently, the power generation efficiency is advantageously enhanced.

The present invention was conceived in view of the situations and it is therefore an object of the present invention to provide a conductive paste composition for a solar cell facilitating control of a penetration amount of an electrode material and enabling easy acquisition of an ohmic contact when an electrode is formed with a fire-through method in a solar cell of a shallow-emitter structure having a thinner n layer.

Means for Solving the Problems

To achieve the object, the present invention provides a conductive paste composition for a solar cell comprising a conductive powder, a glass frit, and a vehicle, the glass frit consisting of glass containing 0.6 to 18.0 (mol %) $Li_2O$, at least one of 0.1 to 6.0 (mol %) $P_2O_5$ and 0.1 to 4.0 (mol %) $Sb_2O_5$, 20 to 62 (mol %) PbO, 1 to 18 (mol %) $B_2O_3$, 18 to 65 (mol %) $SiO_2$, 0 to 6 (mol %) $Al_2O_3$, 0 to 6 (mol %) $TiO_2$, and 0 to 30 (mol %) ZnO in oxide conversion, the glass having a ratio of Pb/Si (mol ratio) within a range of 0.5 to 1.7.

The Effects of the Invention

Consequently, in a conductive paste composition for a solar cell, a glass frit made up of which is consisted of glass containing 20 to 62 (mol %) PbO, 1 to 18 (mol %) $B_2O_3$, 18 to 65 (mol %) $SiO_2$, 0.6 to 18 (mol %) $Li_2O$, at least one of 0.1 to 6.0 (mol %) $P_2O_5$ and 0.1 to 4.0 (mol %) $Sb_2O_5$ and the glass having a ratio of Pb/Si (mol ratio) within a range of 0.5 to 1.7, and further having $Al_2O_3$ within the range of 0 to 6 (mol %), $TiO_2$ within the range of 0 to 6 (mol %), and ZnO within the range of 0 to 30 (mol %) as not an essential but a preferable component. Therefore, sufficiently low contact resistance can be obtained for a substrate with high sheet resistance and the penetration of the electrode material into the pn junction can easily be controlled. Therefore, if the paste composition of the present invention is used for the formation of the light-receiving surface electrode, a solar battery cell may be manufactured that has low leak current, a high fill factor, a large current value, and a high photoelectric conversion rate.

In the glass fit composition, PbO is a component lowering the softening point of glass and is a component for enabling low-temperature firing, and PbO must be equal to or greater than 20 (mol %) and equal to or less than 62 (mol %) to acquire favorable fire-through property. If the amount of PbO is less than 20 (mol %), since the softening point becomes too high, the vitrification becomes difficult; the antireflection film is hardly eroded; and, consequently, a favorable ohmic contact cannot be obtained. If the amount of PbO exceeds 62 (mol %), since the softening point becomes too low, the erodibility becomes too strong; the pn junction is broken; and, consequently, a problem of a small FF value etc., occurs. The amount of PbO is more preferably equal to or greater than 30 (mol %) and more preferably equal to or less than 50 (mol %). In other words, the range of 30 to 50 (mol %) is further preferred.

$B_2O_3$ is a glass forming oxide (i.e., a component that makes up a skeleton of glass) and is a component for lowering the softening point of glass, and $B_2O_3$ must be equal to or greater than 1 (mol %) and equal to or less than 18 (mol %) to acquire favorable fire-through property. If the amount of $B_2O_3$ is less than 1 (mol %), since the softening point becomes too high, the antireflection film is hardly eroded; consequently, a favorable ohmic contact cannot be obtained; and humidity resistance is also reduced. Particularly, because Li is contained in glass in the present invention, glass becomes significantly difficult to melt unless 1 (mol %) or more $B_2O_3$ is contained. On the other hand, if the amount of $B_2O_3$ exceeds 18 (mol %), since the softening point becomes too low, the erodibility becomes too strong and a problem of breaking of the pn junction etc., occurs. An open-circuit voltage Voc tends to decrease at any rate. The amount of $B_2O_3$ is more preferably equal to or greater than 2 (mol %) and more preferably equal to or less than 13 (mol %). In other words, the range of 2 to 13 (mol %) is further preferred. About 3 to 9 (mol %) is particularly preferred.

$SiO_2$ is a glass forming oxide and is a component for increasing the chemical resistance of glass, and $SiO_2$ must be equal to or greater than 18 (mol %) and equal to or less than 65 (mol %) to acquire favorable fire-through property. The amount of $SiO_2$ less than 18 (mol %) makes the chemical resistance insufficient and the glass formation difficult and, on the other hand, if the amount of $SiO_2$ exceeds 65 (mol %), the softening point becomes too high; the vitrification becomes difficult; the antireflection film is hardly eroded; and, consequently, a favorable ohmic contact cannot be obtained. The amount of $SiO_2$ is more preferably equal to or greater than 20 (mol %) and more preferably equal to or less than 45 (mol %). In other words, the range of 20 to 45 (mol %) is further preferred. About 25 to 40 (mol %) is particularly preferred.

Not only are PbO and $SiO_2$ within the respective ranges, Pb/Si (mol ratio) must be equal to or greater than 0.5 and equal to or less than 1.7. If the Pb/Si mol ratio is less than 0.5, i.e., Si is excessive relative to Pb, the fire-through property deteriorates and the contact resistance between the light-receiving surface electrode and the n layer increases. On the other hand, if the Pb/Si mol ratio exceeds 1.7, since a leak current (diode current) Id significantly increases, the FF value decreases at any rate and the sufficient output characteristics cannot be acquired. The Pb/Si (mol ratio) is more preferably within the range of 0.7 to 1.5 and particularly preferably within the range of 0.9 to 1.3.

$Li_2O$ is a component lowering the softening point of glass, and $Li_2O$ must be equal to or greater than 0.6 (mol %) and equal to or less than 18 (mol %) to acquire favorable fire-through property. If $Li_2O$ is less than 0.6 (mol %), the softening point becomes too high and, consequently, the erodibility to the antireflection film is insufficient. On the other hand, if $Li_2O$ exceeds 18 (mol %), since alkali is eluted and the erodibility becomes too high, the electric characteristics are actually deteriorated. Since diffusion is promoted, Li is generally impurity for semiconductors and is desirably avoided in the semiconductor application because of the tendency to deteriorate the characteristics. Particularly, if the amount of Pb is large, the inclusion of Li normally makes the erodibility too strong and tends to make control difficult. However, in the solar cell application as described above, characteristic deterioration due to the usage of glass containing Li is not recognized and, conversely, it is recognized that the inclusion of an appropriate amount of Li improves the fire-through property and enhances the characteristics. Li is a donor element and can reduce the contact resistance. Moreover, it is recognized that a composition including Li broadens a glass composition range enabling the acquisition of favorable fire-through property. However, even in the solar cell application, if Li is excessively contained, the erodibility becomes too strong and the electric characteristics tend to deteriorate. The amount of $Li_2O$ is more preferably equal to or greater than 3 (mol %) and more preferably equal to or less than 12 (mol %), In other words, the range of 3 to 12 (mol %) is further preferred. About 6 to 12 (mol %) is particularly preferred.

$P_2O_5$ and $Sb_2O_5$ are donor elements for the n layer and are components necessary for ensuring the ohmic contact of the light-receiving surface electrode. $P_2O_5$ must be equal to or greater than 0.1 (mol %) and equal to or less than 6.0 (mol %) and $Sb_2O_5$ must be equal to or greater than 0.1 (mol %) and equal to or less than 4.0 (mol %). Although both may be contained together, it is enough to contain one of $P_2O_5$ and $Sb_2O_5$, which may be contained within the range of 0.1 to 10 (mol %) in total. Regardless of which is contained, the effect of addition cannot be acquired in the case of less than 0.1 (mol %). If $P_2O_5$ exceeds 6.0 (mol %) or $Sb_2O_5$ exceeds 4.0 (mol %), glass becomes difficult to melt and a dead layer (layer with high recombination rate) is generated.

To ensure the ohmic contact, it is desirable to allow a donor element to form a solid solution at high concentrations. In the case of a cell with high sheet resistance making up the shallow emitter, it is desirable to set the thickness dimension of the antireflection film consisting of, for example, $Si_3N_4$, to about 80 (nm) and to control an amount of erosion by an electrode within the range of 80 to 90 (nm), i.e., at the accuracy within 10 (nm). However, such control is extremely difficult and control is inevitably provided such that slightly excessive erosion occurs. Therefore, the eroded n layer is complemented with a donor element to suppress the output reduction due to the excessive erosion. To ensure the ohmic contact under such a condition, it is desirable to set the concentration of the donor element equal to or greater than $10^{19}$ (pieces/$cm^3$), preferably, $10^{20}$ (pieces/$cm^3$); however, elements capable of achieving such a high concentration other than glass components such as Li are limited to As, P, and Sb. Among these elements, As is highly toxic and is not preferable for glass production operated in an open system. Therefore, the donor element added for ensuring the ohmic contact is limited to P and Sb.

$Al_2O_3$ is an effective component for acquiring stability of glass, tends to reduce a serial resistance Rs, to increase an FF value, and to broaden a firing temperature range, and is desirably contained in the range equal to or less than 6 (mol %) although $Al_2O_3$ is an arbitrary component. However, the inclusion of Al increases the leak current and if $Al_2O_3$ exceeds 6 (mol %), the open-circuit voltage Voc is significantly reduced. The amount of $Al_2O_3$ is preferably 0.5 to 3.0 (mol %).

$TiO_2$ tends to increase the FF value and is therefore desirably contained although $TiO_2$ is an arbitrary component. However, since the excessive addition tends to raise the softening point and thus increase the contact resistance, $TiO_2$ is desirably contained in the range equal to or less than 6 (mol %). The amount of $TiO_2$ is preferably 1.0 to 5.0 (mol %).

ZnO is an arbitrary component and makes glass difficult to melt if excessive. Since Zn is an acceptor, the excessive content reduces the open-circuit voltage Voc. Therefore, ZnO may not be included and, if included, ZnO is desirably limited to 30 (mol %) or less. If Zn is included, it is preferred to perform adjustment of the composition such as reducing other components such as Si in accordance with the content thereof.

A composition containing appropriate amounts of Al, Ti, and Zn improves a parallel resistance Rsh and thus improves the open-circuit voltage Voc and short-circuit current Isc and, therefore, higher electric characteristics can be acquired.

Although it is not necessarily easy to identify what form the components are contained in glass, all the proportions of these components are defined as oxide-converted values.

The glass making up the conductive paste of the present invention may contain other various glass constituent components and additives within a range not deteriorating the characteristics thereof. For example, Zr, Na, Ca, Mg, K, Ba, Sr, etc., may be contained, These components and additives may be contained within the range equal to or less than 30 (mol %) in total, for example.

Preferably, the glass contains 3.0 to 12.0 (mol %) $Li_2O$, at least one of 0.1 to 4.0 (mol %) $P_2O_5$ and 0.1 to 2.0 (mol %) $Sb_2O_5$, 30 to 50 (mol %) PbO, 2 to 13 (mol %) $B_2O_3$, 20 to 45 (mol %) $SiO_2$, 0 to 6 (mol %) $Al_2O_3$, 0 to 6 (mol %) $TiO_2$, and 0 to 30 (mol %) ZnO and has a ratio of Pb/Si (mol ratio) within the range of 0.5 to 1.7.

Preferably, the glass contains 6.0 to 12.0 (mol %) $Li_2O$, at least one of 0.5 to 2.0 (mol %) $P_2O_5$ and 0.2 to 1.5 (mol %) $Sb_2O_5$, 30 to 50 (mol %) PbO, 3 to 9 (mol %) $B_2O_3$, 25 to 40 (mol %) $SiO_2$, 0 to 6 (mol %) $Al_2O_3$, 0 to 6 (mol %) $TiO_2$, and 0 to 30 (mol %) ZnO and has a ratio of Pb/Si (mol ratio) within the range of 0.5 to 1.7.

Therefore, $Li_2O$ is more preferably within the range of 3.0 to 12.0 (mol %) and particularly preferably within the range of 6.0 to 12.0 (mol %). $P_2O_5$ is more preferably within the range of 0.1 to 4.0 (mol %) and particularly preferably within the range of 0.5 to 2.0 (mol %). $Sb_2O_5$ is more preferably within the range of 0.1 to 2.0 (mol %) and particularly preferably within the range of 0.2 to 1.5 (mol %). PbO is particularly preferably within the range of 30 to 50 (mol %). $B_2O_3$ is more preferably within the range of 2 to 13 (mol %) and particularly preferably within the range of 3 to 9 (mol %). $SiO_2$ is more preferably within the range of 20 to 45 (mol %) and particularly preferably within the range of 25 to 40 (mol %).

The glass frit has an average particle diameter (D50) within the range of 0.3 to 3.0 (μm). If the average particle diameter of the glass frit is too small, glass melts too fast at the time of firing of the electrode and deteriorates the electric characteristics; however, if the average particle diameter is equal to or greater than 0.3 (μm), appropriate meltability can be acquired and the electric characteristics are further enhanced. Since aggregation hardly occurs, more favorable dispersibility can also be acquired when the paste is prepared. If the average particle diameter of the glass frit is significantly larger than the average particle diameter of conductive powder, the overall dispersibility of powder is reduced; however, more favorable dispersibility can be acquired if the average particle diameter is equal to or less than 3.0 (μm). Higher fusibility of glass can also be acquired. Therefore, the average particle diameter described above is preferred for acquiring a more favorable ohmic contact.

The average particle diameter of the glass frit is a value from an air permeability method. The air permeability method refers to a method of measuring a specific surface area of powder from permeability of fluid (e.g., air) through a powder layer. This measuring method is on the basis of the Kozeny-Carman equation indicative of relationship between a wet surface area of all the particles making up the powder layer and a flow rate and a pressure drop of fluid passing through the powder layer and obtains a specific surface area of a sample by measuring a flow rate and a pressure drop for a powder layer filled under the condition determined by an apparatus. This method obtains a wet surface area of particles acting against a flow of air by considering gaps of the filled powder particles as fine pores and normally indicates a value smaller than a specific surface area obtained by a gas absorption method. The average particle diameter on the assumption of powder particles can be calculated from the obtained specific surface area and a particle density.

Preferably, the conductive powder is silver powder having an average particle diameter (D50) within the range of 0.3 to 3.0 (μm). Although copper powder, nickel powder, etc., may be used as the conductive powder, the silver powder is most preferred for acquiring higher electric conductivity. If the average particle diameter of the silver powder is equal to or less than 3.0 (μm), more favorable dispersibility can be acquired and, therefore, higher electric conductivity can be acquired. If the average particle diameter is equal to or greater than 0.3 (μm), the aggregation is suppressed and more favorable dispersibility can be acquired. Since silver powder less than 0.3 (μm) is significantly expensive, the average particle diameter is preferably equal to or greater than 0.3 (μm) in terms of cost. If both the conductive powder and the glass frit have the average particle diameter equal to or less than 3.0 (μm), it is advantageous that clogging hardly occurs when an electrode is printed and formed in a narrow line pattern.

The silver powder is not particularly limited and the powder of any shape such as a spherical shape or a scale shape may be used for enjoying the basic effect of the present invention that enables narrower lines while the electric conductivity is maintained. However, for example, if spherical powder is used, since excellent printability is achieved and a filling rate of the silver powder is increased in an applied film, and additionally because highly-conductive silver is used, the electric conductivity of the electrode generated from the applied film is increased as compared to the case of using the silver powder of another shape such as a scale shape. As a result, since a line width can be made narrower while ensuring necessary electric conductivity, this is particularly preferable.

Preferably, the conductive paste composition for a solar cell has viscosity at 25 (degrees C.) and 20 (rpm) within the range of 150 to 250 (Pa·s) and a viscosity ratio (i.e., viscosity at 10 (rpm)/viscosity at 100 (rpm)) of 3 to 8. When a paste having such viscosity characteristics is used, since the viscosity is preferably lowered at the time of squeezing to allow passage of the paste through a screen mesh and, after passing through, the viscosity returns to the higher level to suppress the broadening of the print width, a narrow line pattern can easily be acquired while maintaining the printability such that the paste easily passes through the screen without causing clogging. The viscosity of the paste composition is more preferably within the range of 160 to 200 (Pa·s) and the viscosity ratio is more preferably within the range of 3.2 to 6.0. If narrower lines are achieved with a design line width equal to or less than 100 (μm), the viscosity ratio is desirably 4 to 6.

Even if a line width is narrowed, the thickening of the film thickness for maintaining a cross-section area can also be achieved by increasing an emulsion thickness of a printing plate, by increasing the tension, and by narrowing a line diameter and widening an opening diameter, for example. However, if an emulsion thickness is increased, since the print plate is not smoothly separated, the stability of the print pattern shape cannot be achieved. If the tension is increased or the line diameter is narrowed, since the screen mesh becomes easily stretchable, it is problematic that the dimension/shape accuracy is hardly maintained and that the durability of the printing plate is reduced. Since a bus bar is also thickened although the bus bar is disposed with a wide width and does not require the thickening of the film thickness, wasted material is problematically increased.

Preferably, the conductive paste composition for a solar cell contains the conductive powder and the vehicle at proportions within ranges of 64 to 90 parts by weight and 3 to 20 parts by weight, respectively. This enables the acquisition of the paste composition having favorable printability and facilitating the formation of an electrode with a narrow line width and high electric conductivity.

Preferably, the conductive paste composition contains the glass frit within the range of 1 to 10 parts by weight per 100 parts by weight of the conductive powder. If 1 part by weight or more of the glass frit is contained, sufficient erodibility (fire-through property) can be acquired and, therefore, a more favorable ohmic contact can be acquired. If the glass frit is limited to 10 parts by weight or less, an insulated layer is hardly formed and, therefore, sufficient electric conductivity can be achieved. The amount of glass per 100 parts by weight of the conductive powder is more preferably 1 to 8 parts by weight and is further preferably 1 to 7 parts by weight.

The conductive composition of the present invention may preferably control the diffusion of silver at the time of formation of an electrode with fire-through as described above and thus may preferably be used for the light-receiving surface electrode.

Although the glass frit can be synthesized from various vitrifiable raw materials within the composition ranges including, for example, oxide, carbonate, and nitrate, silicon dioxide $SiO_2$, boron oxide $B_2O_3$, and minium $Pb_3O_4$ may be used as sources of Si, B, and Pb, respectively, for example.

If the composition includes other components such as Al and Zr in addition to the main components Si, B, and Pb, oxide, hydroxide, carbonate, nitrate, etc., thereof may be used, for example.

MODES FOR CARRYING OUT THE INVENTION

An embodiment of the present invention will now be described in detail with reference to the drawings. In the following embodiment, diagrams are simplified or modified as needed and dimensional ratios and shapes of portions are not necessarily exactly depicted.

Figure 1:
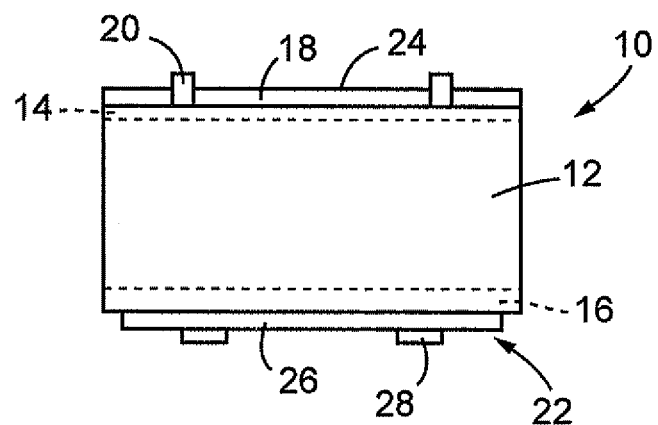
FIG. 1 is a schematic of a cross section structure of a solar cell to which a paste composition for an electrode of one embodiment of the present invention is applied to the formation of a light-receiving surface electrode.

FIG. 1 is a schematic of a cross section structure of a silicon-based solar cell 10 to which a conductive composition of one embodiment of the present invention is applied. In FIG. 1, the solar cell 10 includes, for example, a silicon substrate 12 that is a p-type polycrystalline semiconductor, an n layer 14 and a $p^+$ layer 16 formed respectively on the upper and lower surfaces thereof, an antireflection film 18 and a light-receiving surface electrode 20 formed on the n layer 14, and a rear surface electrode 22 formed on the $p^+$ layer 16. The thickness dimension of the silicon substrate 12 is about 100 to 200 (μm), for example.

The n layer 14 and the $p^+$ layer 16 are disposed by forming layers having high impurity concentrations on the upper and lower surfaces of the silicon substrate 12, and the thickness dimensions of the high concentration layers are about 70 to 100 (nm) for the n layer 14, for example, and about 500 (nm) for the $p^+$ layer 16, for example. Although the n layer 14 is about 100 to 200 (nm) in a typical silicon-based solar cell, the n layer 14 of this embodiment has a thinner thickness and forms a structure called shallow emitter. The impurity contained in the n layer 14 is an n-type dopant, for example, phosphorus (P) and the impurity contained in the $p^+$ layer 16 is a p-type dopant, for example, aluminum (Al) or boron (B).

The antireflection film 18 is, for example, a thin film made of silicon nitride $Si_3N_4$ etc., and is disposed with, for example, an optical thickness of about ¼ of the visible light wavelength, for example, about 80 (nm), to have an extremely low reflectance equal to 10 (%) or less, for example, about 2 (%).

Figure 2:
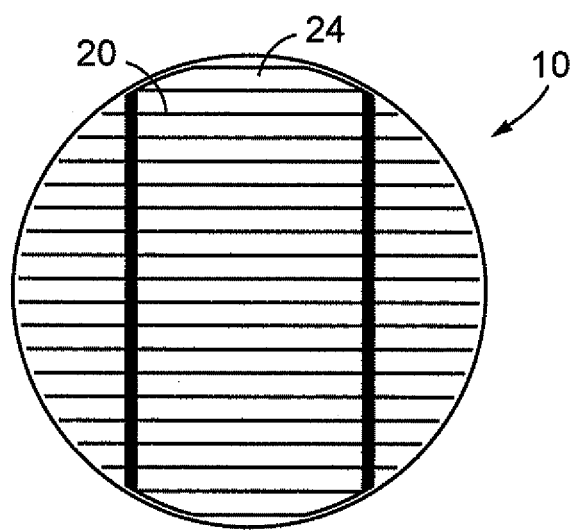
FIG. 2 is a diagram of one example of a pattern for the light-receiving surface electrode of the solar cell depicted in FIG. 1.

The light-receiving surface electrode 20 consists of a thick film conductor having a uniform thickness dimension, for example, and is disposed in a comb-like planar shape having a multiplicity of thin line portions on substantially the entire surface of a light-receiving surface 24 as depicted in FIG. 2.

The thick film conductor is made of a thick film silver containing 1 to 10 parts by weight, for example, 4.8 parts by weight, of glass per 100 parts by weight of Ag and the glass is flint glass containing PbO within the range of 20 to 62 (mol %), for example, at about 38 (mol %), $B_2O_3$ within the range of 1 to 18 (mol %), for example, at about 8.0 (mol %), $SiO_2$ within the range of 18 to 65 (mol %), for example, at about 30.0 (mol %), $Li_2O$ within the range of 0.6 to 18 (mol %), for example, at about 12.0 (mol %), $Al_2O_3$ within the range of 0 to 6 (mol %), for example, at about 3.0 (mol %), $TiO_2$ within the range of 0 to 6 (mol %), for example, at about 3.0 (mol %), ZnO within the range of 0 to 30 (mol %), for example, at about 5.0 (mol %), $P_2O_5$ within the range of 0 to 6 (mol %), for example, at about 0.5 (mol %), and $Sb_2O_5$ within the range of 0 to 4 (mol %), for example, at about 0.5 (mol %) in oxide conversion. The flint glass contains PbO and $SiO_2$ such that the Pb/Si mol ratio is within the range of 0.5 to 1.7, for example, about 1.27.

The thickness dimension of the conductive layer is, for example, within the range of 20 to 30 ($\mu$m), for example, about 25 ($\mu$m), and the width dimension of each of the thin line portions is, for example, within the range of 80 to 130 ($\mu$m), for example, about 100 ($\mu$m), resulting in sufficiently high electric conductivity.

The rear surface electrode 22 is made up of an entire surface electrode 26 formed by applying a thick film material having aluminum as a conductive component onto substantially the entire surface of the p$^+$ layer 16 and a belt-like electrode 28 made of a thick film silver applied in a belt shape onto the entire surface electrode 26. The belt-like electrode 28 is disposed for the purpose of enabling soldering of conductive wires etc., to the rear surface electrode 22.

Since the solar cell 10 of this embodiment has the light-receiving surface electrode 20 made up of the thick film silver including the flint glass within the range of 1 to 10 parts by weight per 100 parts by weight of silver and the flint glass has the composition including PbO within the range of 20 to 62 (mol %), $B_2O_3$ within the range of 1 to 18 (mol %), $SiO_2$ within the range of 18 to 65 (mol %) and at the Pb/Si mol ratio within the range of 0.5 to 1.7, $Li_2O$ within the range of 0.6 to 18 (mol %), $Al_2O_3$ within the range of 0 to 6 (mol %), $TiO_2$ within the range of 0 to 6 (mol %), ZnO within the range of 0 to 30 (mol %), $P_2O_5$ within the range of 0 to 6 (mol %), and $Sb_2O_5$ within the range of 0 to 4 (mol %) as described above, the erosion amount is controlled to a depth of about 80 to 90 (nm), i.e., up to about 10 (nm) larger than the thickness dimension of the antireflection film 18 and, therefore, a favorable ohmic contact with the n layer 14 can be acquired in spite of a line width reduced to about 100 ($\mu$m), resulting in low contact resistance.

Since the light-receiving surface electrode 20 of this embodiment includes a smaller glass amount of about 4.8 parts by weight and thus has high electric conductivity as described above, the line resistance is low in spite of a small film thickness and a line width and, therefore, also because of low contact resistance, the photoelectric conversion efficiency of the solar cell 10 is improved.

The light-receiving surface electrode 20 as described above is formed by using a paste for an electrode consisting of a conductive powder, a glass frit, a vehicle, and a solvent, for example, with a well-known fire-through method. An example of a fabricating method of the solar cell 10 including the light-receiving surface electrode formation will hereinafter be described.

First, the glass frit is manufactured. Lithium carbonate $Li_2CO_3$, antimony trioxide $Sb_2O_3$, ammonium dihydrogenphosphate $NH_4H_2PO_4$, silicon dioxide $SiO_2$, boron oxide $B_2O_3$, minium $Pb_3O_4$, aluminum oxide $Al_2O_3$, titanium oxide $TiO_2$, and zinc oxide ZnO are prepared as sources of Li, Sb, P, Si, B, Pb, Al, Ti, and Zn, respectively, and are weighed and blended so as to achieve appropriate composition within the ranges described above. These are put into a crucible, melted for about 30 minutes to one hour at a temperature within a range of 900 to 1200 (degrees C.) depending on the composition, and quenched for vitrification. The glass is crushed by using a suitable crushing device such as a planetary mill and ball mill. The average particle diameter (D50) after crushing is about 0.3 to 3.0 ($\mu$m). The average particle diameter of the glass powder is calculated by using the air permeability method.

On the other hand, the conductive powder is prepared as commercially available spherical silver powder having, for example, an average particle diameter (D50) within the range of 0.3 to 3.0 ($\mu$m). By using such silver powder having a sufficiently small average particle diameter, a filling rate of the silver powder is increased in an applied film and the electric conductivity of the conductor can consequently be increased. The vehicle is prepared by dissolving an organic binder in an organic solvent; for example, butyl carbitol acetate is used as the organic solvent; and, for example, ethyl cellulose is used as the organic binder. The proportion of ethyl cellulose in the vehicle is about 15 (wt %), for example. A solvent added separately from the vehicle is butyl carbitol acetate, for example. Although this is not a limitation, the solvent may be the same as that used for the vehicle. This solvent is added for the purpose of adjusting the viscosity of the paste.

After the paste raw materials are prepared and the conductive powder, the glass frit, the vehicle, and the solvent are weighed to be 77 to 88 (wt %), 1 to 6 (wt %), 7 to 14 (wt %), and 3 to 5 (wt %), respectively, for example, and are mixed by using a stirring machine, etc., a dispersion process is executed by a three roll mill, for example. As a result, the paste for an electrode is acquired.

While the paste for an electrode is prepared as described above, an impurity is dispersed or implanted in an appropriate silicon substrate with, for example, a well-known method such as a thermal diffusion method and ion implantation to form the n layer 14 and the p$^+$ layer 16 to manufacture the silicon substrate 12. A silicon nitride thin film is then formed thereon with, for example, a suitable method such as PE-CVD (plasma CVD) to dispose the antireflection film 18.

The paste for an electrode is then screen-printed in the pattern depicted in FIG. 2 on the antireflection film 18. The paste is dried at 150 (degrees C.), for example, and then, is subjected to a firing treatment at a temperature within the range of 700 to 900 (degrees C.) in a near-infrared furnace. As a result, since the glass component in the paste for an electrode melts the antireflection film 18 in the course of the firing and the paste for an electrode breaks the antireflection film 18, electric connection is achieved between the conductive component, i.e., silver, in the paste for an electrode and the n layer 14, and the ohmic contact is acquired between the silicon substrate 12 and the light-receiving surface electrode 20 as depicted in FIG. 1. The light-receiving surface electrode 20 is formed as described above.

The rear surface electrode 22 may be formed after the above operation or may be formed by firing at the same time as the light-receiving surface electrode 20. When the rear surface electrode 22 is formed, for example, an aluminum paste is applied to the entire rear surface of the silicon substrate 12 with a screen printing method etc., and is subjected to the firing treatment to form the entire surface electrode 26 consisting of an aluminum thick film. The paste for an electrode is then applied onto the surface of the entire surface electrode 26 in a belt shape by using the screen printing method etc., and is subjected to the firing treatment to form the belt-like electrode 28. As a result, the rear surface electrode 22 is formed that consists of the entire surface electrode 26 covering the entire rear surface and the belt-like electrode 28 disposed on a portion of the surface thereof in a belt shape, and the solar cell 10 is acquired. In the operation described above, if the concurrent firing is used for the fabrication, the printing process is executed before the firing of the light-receiving surface electrode 20.

Table 1 and Table 2 describe results of evaluation of the fill factor FF value and the leak current Id acquired by fabricating the solar cell 10 in accordance with the fabrications steps described above with variously changed glass compositions and measuring the outputs thereof by using a commercially available solar simulator, along with the glass compositions. In Tables 1 and 2, Nos. 3 to 8, 11 to 13, 16 to 19, 22 to 25, 27 to 30, 32 to 34, 36 to 38, 40, 42 to 56, 58, 59, 63 to 65, 67 to 70, and 72 to 75 are embodiments and the others are comparison examples. The FF value is a criterion for determining whether a favorable ohmic contact is acquired and, although it is considered that a solar cell is generally usable if the FF value is equal to or greater than 70, a higher FF value is naturally more preferable and the embodiments having an FF value greater than 75 are considered to be acceptable. A lower leak current is more preferable and the leak current is a criterion for determining whether the penetration of the electrode into the pn junction occurs. The leak current is indicated by a double circle when a numerical value at 10 (V) is 0.2 (A) or less, by a circle when the value is 0.5 (A) or less, by a triangle when the value is 1.0 (A) or less, or by a cross mark when the value is 1.0 (A) or greater.

TABLE 1

| No. | Pb/Si MOLAR RATIO | COMPOSITION (mol %) | | | | | | | | DETERMINATION | | OUTPUT CHARACTERISTIC |
| | | PbO | $B_2O_3$ | $SiO_2$ | $Al_2O_3$ | $Li_2O$ | $TiO_2$ | ZnO | $P_2O_5$ | $Sb_2O_5$ | FF | Id | |
| --- | --- | --- | --- | --- | --- | --- | --- | --- | --- | --- | --- | --- | --- |
| 1 | 1.11 | 50.0 | 5.0 | 45.0 | | | | | | | 67 | △ | X |
| 2 | 1.26 | 48.3 | 12.0 | 38.3 | | 0.4 | | | 0.5 | 0.5 | 74 | ○ | X |
| 3 | 1.26 | 48.1 | 12.0 | 38.3 | | 0.6 | | | 0.5 | 0.5 | 75 | ○ | ○ |
| 4 | 1.26 | 47.9 | 12.0 | 38.1 | | 1.0 | | | 0.5 | 0.5 | 75 | ○ | ○ |
| 5 | 1.26 | 46.9 | 12.0 | 37.1 | | 3.0 | | | 0.5 | 0.5 | 76 | ○ | ○ |
| 6 | 1.28 | 45.4 | 12.0 | 35.6 | | 6.0 | | | 0.5 | 0.5 | 77 | ○ | ○ |
| 7 | 1.30 | 42.4 | 12.0 | 32.6 | | 12.0 | | | 0.5 | 0.5 | 78 | ○ | ○ |
| 8 | 1.33 | 39.4 | 12.0 | 29.6 | | 18.0 | | | 0.5 | 0.5 | 75 | X | ○ |
| 9 | 1.35 | 37.9 | 12.0 | 28.1 | | 21.0 | | | 0.5 | 0.5 | 73 | X | X |
| 10 | 0.36 | 20.0 | 12.0 | 55.0 | | 12.0 | | | 0.5 | 0.5 | 53 | ○ | X |
| 11 | 0.50 | 25.0 | 12.0 | 50.0 | | 12.0 | | | 0.5 | 0.5 | 75 | ○ | ○ |
| 12 | 0.65 | 32.0 | 6.0 | 49.0 | | 12.0 | | | 0.5 | 0.5 | 76 | ○ | ○ |
| 13 | 1.70 | 51.0 | 6.0 | 30.0 | | 12.0 | | | 0.5 | 0.5 | 75 | △ | ○ |
| 14 | 1.89 | 53.0 | 6.0 | 28.0 | | 12.0 | | | 0.5 | 0.5 | 65 | X | X |
| 15 | 1.27 | 45.85 | 6.0 | 36.1 | | 12.0 | | | | 0.05 | 74 | ○ | X |
| 16 | 1.27 | 45.8 | 6.0 | 36.1 | | 12.0 | | | | 0.1 | 75 | ○ | ○ |
| 17 | 1.28 | 45.4 | 6.0 | 35.6 | | 12.0 | | | | 1.0 | 77 | ◉ | ○ |
| 18 | 1.28 | 44.9 | 6.0 | 35.1 | | 12.0 | | | | 2.0 | 76 | ◉ | ○ |
| 19 | 1.29 | 43.9 | 6.0 | 34.1 | | 12.0 | | | | 4.0 | 75 | ◉ | ○ |
| 20 | 1.29 | 43.4 | 6.0 | 33.6 | | 12.0 | | | | 5.0 | 73 | ○ | X |
| 21 | 1.27 | 45.85 | 6.0 | 36.1 | | 12.0 | | | 0.05 | | 74 | ○ | X |
| 22 | 1.27 | 45.8 | 6.0 | 36.1 | | 12.0 | | | 0.1 | | 75 | ○ | ○ |
| 23 | 1.28 | 45.4 | 6.0 | 35.6 | | 12.0 | | | 1.0 | | 78 | ○ | ○ |
| 24 | 1.28 | 44.4 | 6.0 | 34.6 | | 12.0 | | | 3.0 | | 77 | ○ | ○ |
| 25 | 1.30 | 42.9 | 6.0 | 33.1 | | 12.0 | | | 6.0 | | 76 | ○ | ○ |
| 26 | 1.31 | 41.9 | 6.0 | 32.1 | | 12.0 | | | 8.0 | | 74 | △ | X |
| 27 | 0.50 | 32.0 | 1.0 | 64.0 | | 2.0 | | | 0.5 | 0.5 | 75 | △ | ○ |
| 28 | 1.60 | 32.0 | 12.0 | 20.0 | 3.0 | 12.0 | 3.0 | 17.0 | 0.5 | 0.5 | 75 | △ | ○ |
| 29 | 1.67 | 60.0 | 1.0 | 36.0 | | 2.0 | | | 0.5 | 0.5 | 75 | △ | ○ |
| 30 | 0.67 | 20.0 | 12.0 | 30.0 | 3.0 | 12.0 | 3.0 | 19.0 | 0.5 | 0.5 | 75 | ○ | ○ |
| 31 | 0.63 | 25.9 | | 41.1 | 3.0 | 12.0 | 3.0 | 14.0 | 0.5 | 0.5 | 73 | X | X |
| 32 | 0.63 | 25.9 | 1.0 | 41.1 | 3.0 | 12.0 | 3.0 | 13.0 | 0.5 | 0.5 | 75 | ○ | ○ |
| 33 | 0.63 | 25.9 | 12.0 | 41.1 | 3.0 | 12.0 | 3.0 | 2.0 | 0.5 | 0.5 | 77 | ○ | ○ |
| 34 | 0.63 | 24.3 | 18.0 | 38.7 | 3.0 | 12.0 | 3.0 | | 0.5 | 0.5 | 75 | △ | ○ |
| 35 | 0.63 | 23.2 | 21.0 | 36.8 | 3.0 | 12.0 | 3.0 | | 0.5 | 0.5 | 70 | X | X |
| 36 | 0.63 | 25.9 | 8.0 | 41.1 | | 12.0 | 3.0 | 9.0 | 0.5 | 0.5 | 75 | ◉ | ○ |
| 37 | 0.63 | 25.9 | 8.0 | 41.1 | 3.0 | 12.0 | 3.0 | 6.0 | 0.5 | 0.5 | 77 | ○ | ○ |
| 38 | 0.63 | 25.9 | 8.0 | 41.1 | 6.0 | 12.0 | 3.0 | 3.0 | 0.5 | 0.5 | 76 | △ | ○ |
| 39 | 0.63 | 25.9 | 8.0 | 41.1 | 9.0 | 12.0 | 3.0 | | 0.5 | 0.5 | 72 | X | X |
| 40 | 1.26 | 30.1 | 3.0 | 23.9 | | 12.0 | | 30.0 | 0.5 | 0.5 | 75 | △ | ○ |
| 41 | 1.26 | 27.3 | 3.0 | 21.7 | | 12.0 | | 35.0 | 0.5 | 0.5 | 70 | X | X |

TABLE 2

| No. | Pb/Si MOLAR RATIO | COMPOSITION (mol %) | | | | | | | | | DETERMINATION | | |
| --- | --- | --- | --- | --- | --- | --- | --- | --- | --- | --- | --- | --- | --- |
| | | PbO | $B_2O_3$ | $SiO_2$ | $Al_2O_3$ | $Li_2O$ | $TiO_2$ | ZnO | $P_2O_5$ | $Sb_2O_5$ | FF | Id | OUTPUT CHARACTERISTIC |
| 42 | 0.91 | 32.0 | 8.0 | 35.0 | 3.0 | 12.0 | 3.0 | 6.0 | 0.5 | 0.5 | 78 | ○ | ○ |
| 43 | 1.00 | 32.0 | 12.0 | 32.0 | 3.0 | 12.0 | 3.0 | 5.0 | 0.5 | 0.5 | 78 | ○ | ○ |
| 44 | 0.91 | 32.0 | 8.0 | 35.0 | | 12.0 | 6.0 | 6.0 | 0.5 | 0.5 | 77 | ○ | ○ |
| 45 | 1.19 | 38.0 | 8.0 | 32.0 | 3.0 | 6.0 | 3.0 | 9.0 | 0.5 | 0.5 | 77 | ○ | ○ |
| 46 | 1.19 | 38.0 | 8.0 | 32.0 | 3.0 | 10.0 | 3.0 | 5.0 | 0.5 | 0.5 | 78 | ○ | ○ |
| 47 | 1.27 | 38.0 | 8.0 | 30.0 | 3.0 | 12.0 | 3.0 | 5.0 | 1.0 | | 78 | ◎ | ○ |
| 48 | 1.27 | 38.0 | 8.0 | 30.0 | 3.0 | 12.0 | 3.0 | 5.0 | | 1.0 | 78 | ◎ | ○ |
| 49 | 1.27 | 38.0 | 8.0 | 30.0 | 3.0 | 12.0 | 3.0 | 5.0 | 0.5 | 0.5 | 78 | ◎ | ○ |
| 50 | 1.27 | 38.0 | 8.0 | 30.0 | | 11.0 | 6.0 | 6.0 | | 1.0 | 77 | ◎ | ○ |
| 51 | 1.27 | 38.0 | 8.0 | 30.0 | | 11.0 | 6.0 | 6.0 | 0.5 | 0.5 | 77 | ◎ | ○ |
| 52 | 1.27 | 38.0 | 8.0 | 30.0 | 3.0 | 12.0 | 3.0 | 5.8 | | 0.2 | 78 | ○ | ○ |
| 53 | 1.27 | 38.0 | 8.0 | 30.0 | 3.0 | 12.0 | 3.0 | 5.0 | 0.5 | 0.5 | 78 | ○ | ○ |
| 54 | 1.27 | 38.0 | 8.0 | 30.0 | 3.0 | 12.0 | 3.0 | 5.0 | 0.8 | 0.2 | 78 | ○ | ○ |
| 55 | 1.27 | 38.0 | 8.0 | 30.0 | 3.0 | 12.0 | 3.0 | 5.8 | 0.2 | | 78 | ○ | ○ |
| 56 | 1.27 | 38.0 | 8.0 | 30.0 | 3.0 | 12.0 | 3.0 | 5.0 | 0.2 | 0.8 | 78 | ◎ | ○ |
| 57 | 1.83 | 63.0 | 1.0 | 34.4 | | 1.0 | | | 0.5 | 0.1 | 73 | Δ | X |
| 58 | 1.68 | 61.0 | 1.0 | 36.4 | | 1.0 | | | 0.5 | 0.1 | 75 | Δ | ○ |
| 59 | 1.00 | 20.0 | 18.0 | 20.0 | 3.0 | 10.0 | 3.0 | 25.0 | 0.5 | 0.5 | 75 | Δ | ○ |
| 60 | 0.90 | 18.0 | 18.0 | 20.0 | 3.0 | 10.0 | 3.0 | 27.0 | 0.5 | 0.5 | 72 | Δ | X |
| 61 | 1.33 | 20.0 | 18.0 | 15.0 | 3.0 | 12.0 | 3.0 | 26.5 | 2.0 | 0.5 | 73 | Δ | X |
| 62 | 0.43 | 29.0 | 1.0 | 67.0 | | 2.0 | | | 0.5 | 0.5 | 63 | Δ | X |
| 63 | 1.27 | 38.0 | 8.0 | 30.0 | 0.5 | 12.0 | 3.0 | 7.5 | 1.0 | | 78 | ◎ | ○ |
| 64 | 1.27 | 38.0 | 8.0 | 30.0 | 1.0 | 12.0 | 3.0 | 7.0 | 1.0 | | 78 | ◎ | ○ |
| 65 | 1.27 | 38.0 | 8.0 | 30.0 | 3.0 | 12.0 | 1.0 | 7.0 | 1.0 | | 77 | ○ | ○ |
| 66 | 1.27 | 38.0 | 8.0 | 30.0 | 3.0 | 12.0 | 7.0 | 1.0 | 1.0 | | 74 | ◎ | X |
| 67 | 1.27 | 41.6 | 8.7 | 32.8 | 0.5 | 12.0 | 3.0 | | 1.0 | 0.4 | 78 | ◎ | ○ |
| 68 | 1.27 | 41.1 | 8.6 | 32.4 | 0.5 | 12.0 | 3.0 | | 2.0 | 0.4 | 78 | ◎ | ○ |
| 69 | 1.27 | 40.1 | 8.4 | 31.6 | 0.5 | 12.0 | 3.0 | | 4.0 | 0.4 | 77 | ◎ | ○ |
| 70 | 1.27 | 39.1 | 8.2 | 30.8 | 0.5 | 12.0 | 3.0 | | 6.0 | 0.4 | 76 | ○ | ○ |
| 71 | 1.27 | 37.6 | 7.9 | 29.6 | 0.5 | 12.0 | 3.0 | | 9.0 | 0.4 | 74 | Δ | X |
| 72 | 1.11 | 20.0 | 18.0 | 18.0 | 3.0 | 12.0 | 3.0 | 23.5 | 2.0 | 0.5 | 75 | Δ | ○ |
| 73 | 1.27 | 37.3 | 7.8 | 29.4 | 0.5 | 12.0 | 3.0 | | 6.0 | 4.0 | 75 | ○ | ○ |
| 74 | 1.27 | 38.8 | 8.2 | 30.6 | 0.5 | 12.0 | 3.0 | | 6.0 | 1.0 | 76 | ○ | ○ |
| 75 | 1.27 | 38.3 | 8.1 | 30.2 | 0.5 | 12.0 | 3.0 | | 4.0 | 4.0 | 75 | ○ | ○ |
| 76 | 1.27 | 36.3 | 7.6 | 28.6 | 0.5 | 12.0 | 3.0 | | 8.0 | 4.0 | 73 | Δ | X |

The samples were fabricated by using a spherical Ag powder having the average particle diameter of 1.6 (μm) and glass fit having the average particle diameter of 1.5 (μm). Preparation proportions were basically 83 (wt %) Ag powder, 5 (wt %) glass fit, 8 (wt %) vehicle, and 5 (wt %) solvent, and the amounts of a vehicle and a solvent were adjusted such that the viscosity at 25 (degrees C.) and 20 (rpm) is set to 160 to 180 (Pa·s) so as to achieve equal printability. A printing plate for forming the light-receiving surface electrode 20 was a SUS325 screen mesh having the wire diameter of 23 (μm) provided with 20-(μm)-thick emulsion. A printing condition was set such that a width dimension of grid lines was set to 100 (μm). Sheet resistance of a substrate was evaluated by using 90±10 (Ω/sq).

Tables 1 and 2 describe the following embodiments:
a six-component system of PbO—$B_2O_3$—$SiO_2$—$Li_2O$—$P_2O_5$—$Sb_2O_5$;
a five-component system of PbO—$B_2O_3$—$SiO_2$—$Li_2O$—$Sb_2O_5$;
a five-component system of PbO—$B_2O_3$—$SiO_2$—$Li_2O$—$P_2O_5$;
a nine-component system of PbO—$B_2O_3$—$SiO_2$—$Al_2O_3$—$Li_2O$—$TiO_2$—ZnO—$P_2O_5$—$Sb_2O_5$;
an eight-component system of PbO—$B_2O_3$—$SiO_2$—$Al_2O_3$—$Li_2O$—$TiO_2$—$P_2O_5$—$Sb_2O_5$;
an eight-component system of PbO—$B_2O_3$—$SiO_2$—$Li_2O$—$TiO_2$—ZnO—$P_2O_5$—$Sb_2O_5$;
a seven-component system of PbO—$B_2O_3$—$SiO_2$—$Li_2O$—ZnO—$P_2O_5$—$Sb_2O_5$;
an eight-component system of PbO—$B_2O_3$—$SiO_2$—$Al_2O_3$—$Li_2O$—$TiO_2$—ZnO—$P_2O_5$;
an eight-component system of PbO—$B_2O_3$—$SiO_2$—$Al_2O_3$—$Li_2O$—$TiO_2$—ZnO—$Sb_2O_5$; and
a seven-component system of PbO—$B_2O_3$—$SiO_2$—$Li_2O$—$TiO_2$—ZnO—$Sb_2O_5$.

In the embodiment Nos. 3 to 8, 11 to 13, 27, 29, and 58 corresponding to the six-component system lacking $Al_2O_3$, $TiO_2$, and ZnO, the FF value exceeding 75 was acquired within ranges of PbO of 25.0 to 61.0 (mol %), $B_2O_3$ of 1.0 to 12.0 (mol %), $SiO_2$ of 29.6 to 64.0 (mol %), $Li_2O$ of 0.6 to 18.0 (mol %), $P_2O_5$ of 0.5 (mol %), $Sb_2O_5$ of 0.1 to 0.5 (mol %), and Pb/Si of 0.5 to 1.70. In this six-component system, the comparison example Nos. 2 and 9 had $Li_2O$ reduced to 0.4 (mol %) and increased to 21.0 (mol %), respectively, and generated the FF values limited to 74 and 73, respectively. It is believed that this is because excessive $Li_2O$ makes the erodibility too strong at the time of firing for the electrode formation. The comparison example Nos. 10, 14, 57, and 62 had the Pb/Si ratios reduced to 0.36, increased to 1.89, increased to 1.83, and reduced to 0.43, respectively, and generated the FF values limited to 53, 65, 73, and 63, respectively. Comparing the embodiments with the comparison examples, it is understood that the characteristics cannot be acquired in the six-component system if $Li_2O$ is equal to or less than 0.4 (mol %) or equal to or greater than 21.0 (mol %) or if the Pb/Si ratio is equal to or less than 0.43 or equal to or greater than 1.83.

In the embodiment Nos. 16 to 19 corresponding to the five-component system lacking $P_2O_5$ as compared to the six-component system, the FF value exceeding 75 was acquired in each case within ranges of PbO of 43.9 to 45.8 (mol %), $B_2O_3$ of 6.0 (mol %), $SiO_2$ of 34.1 to 36.1 (mol %), $Li_2O$ of 12.0 (mol %), $Sb_2O_5$ of 0.1 to 4.0 (mol %), and Pb/Si of 1.27 to 1.29. The leak current Id is small and favorable in each result. On the other hand, the comparison example Nos. 15 and 20 of the same component system included $Sb_2O_5$ of 0.05 (mol %) and 5.0 (mol %), respectively, and generated the FF values limited to 74 and 73, respectively, and it is confirmed that $Sb_2O_5$ is too little or too much.

In the embodiment Nos. 22 to 25 corresponding to the five-component system including $P_2O_5$ instead of $Sb_2O_5$, the FF value exceeding 75 was acquired in each case within ranges of PbO of 42.9 to 45.8 (mol %), $B_2O_3$ of 6.0 (mol %), $SiO_2$ of 33.1 to 36.1 (mol %), $Li_2O$ of 12.0 (mol %), $P_2O_5$ of 0.1 to 6.0 (mol %), and Pb/Si of 1.27 to 1.30. The leak current Id is small and favorable in each result. On the other hand, the comparison example Nos. 21 and 26 of the same component system included $P_2O_5$ of 0.05 (mol %) and 8.0 (mol %), respectively and generated the FF value limited to 74, and it is confirmed that $P_2O_5$ is too little or too much. In the comparison example No. 26, the reduction of the current value was recognized.

In the embodiment Nos. 28, 30, 32, 33, 37, 38, 42, 43, 45, 46, 49, 53, 54, 56, 59, and 72 corresponding to the nine-component system of PbO—$B_2O_3$—$SiO_2$—$Al_2O_3$—$Li_2O$—$TiO_2$—$ZnO$—$P_2O_5$—$Sb_2O_5$, the FF value exceeding 75 was acquired in each case within ranges of PbO of 20.0 to 38.0 (mol %), $B_2O_3$ of 1.0 to 18.0 (mol %), $SiO_2$ of 18 to 41.1 (mol %), $Al_2O_3$ of 3.0 to 6.0 (mol %), $Li_2O$ of 6.0 to 12.0 (mol %), $TiO_2$ of 3.0 (mol %), ZnO of 3.0 to 25.0 (mol %), $P_2O_5$ of 0.2 to 2.0 (mol %), $Sb_2O_5$ of 0.2 to 0.8 (mol %), and Pb/Si of 0.63 to 1.60. On the other hand, the comparison example Nos. 60 and 61 of the same nine-component system included PbO reduced to 18.0 (mol %) and $SiO_2$ reduced to 15.0 (mol %), respectively, and generated the FF values limited to 72 and 73, respectively, and it is confirmed that PbO or $SiO_2$ is too little. The comparison example No. 31 lacking $B_2O_3$ corresponds to the nine-component system when $B_2O_3$ is too little and also generated the FF value limited to 73, and it is confirmed that $B_2O_3$ is essential.

In the embodiment Nos. 34, 67 to 70, and 73 to 75 corresponding to the eight-component system lacking ZnO, the FF value exceeding 75 was acquired in each case within ranges of PbO of 24.3 to 41.6 (mol %), $B_2O_3$ of 7.8 to 18.0 (mol %), $SiO_2$ of 29.4 to 38.7 (mol %), $Al_2O_3$ of 0.5 to 3.0 (mol %), $Li_2O$ is 12.0 (mol %), $TiO_2$ of 3.0 (mol %), $P_2O_5$ of 0.5 to 6.0 (mol %), $Sb_2O_5$ of 0.5 to 4.0 (mol %), and Pb/Si of 0.63 to 1.27. On the other hand, the comparison example Nos. 35, 39, 71, and 76 of the same eight-component system included $B_2O_3$ increased to 21.0 (mol %), $Al_2O_3$ increased to 9.0 (mol %), $P_2O_5$ increased to 9.0 (mol %) and 8.0 (mol %), respectively, and generated the FF values limited to 70 to 74, and it is confirmed that $B_2O_3$, $Al_2O_3$, or $P_2O_5$ is too much.

In the embodiment Nos. 36, 44, and 51 corresponding to the eighth-component system lacking $Al_2O_3$, the FF value exceeding 75 was acquired in each case within ranges of PbO of 25.9 to 38.0 (mol %), $B_2O_3$ of 8.0 (mol %), $SiO_2$ of 30.0 to 41.1 (mol %), $Li_2O$ of 11.0 to 12.0 (mol %), $TiO_2$ of 3.0 to 6.0 (mol %), ZnO of 6.0 to 9.0 (mol %), $P_2O_5$ of 0.5 (mol %), $Sb_2O_5$ of 0.5 (mol %), and Pb/Si of 0.63 to 1.27.

The embodiment No. 40 corresponds to the seven-component system lacking $Al_2O_3$ and $TiO_2$ and No. 50 corresponds to the seven-component system lacking $Al_2O_3$ and $P_2O_5$. In such a seven-component system, the FF value exceeding 75 was acquired within ranges of PbO of 30.1 to 38.0 (mol %), $B_2O_3$ of 3.0 to 8.0 (mol %), $SiO_2$ of 23.9 to 30.0 (mol %), $Li_2O$ of 11.0 to 12.0 (mol %), $TiO_2$ of 0 to 6.0 (mol %), ZnO of 6.0 to 30.0 (mol %), $P_2O_5$ of 0 to 0.5 (mol %), $Sb_2O_5$ of 0.5 to 1.0 (mol %), and Pb/Si of 1.26 to 1.27. In the comparison example No. 41 including the ZnO amount of 35.0 (ml %), the FF value was limited to 70. At least in the seven-component system, the ZnO amount of 35.0 (ml %) is too much.

In the embodiment Nos. 47, 55, and 63 to 65 corresponding to the eight-component system lacking $Sb_2O_5$, the FF value exceeding 75 was acquired in each case within ranges of PbO of 38.0 (mol %), $B_2O_3$ of 8.0 (mol %), $SiO_2$ of 30.0 (mol %), $Al_2O_3$ of 0.5 to 3.0 (mol %), $Li_2O$ of 12.0 (mol %), $TiO_2$ of 1.0 to 3.0 (mol %), ZnO of 5.0 to 7.5 (mol %), $P_2O_5$ of 0.2 to 1.0 (mol %), and Pb/Si of 1.27. On the other hand, in the comparison example No. 66 including the $TiO_2$ amount of 7.0 (mol %), the FF value was limited to 74 and it is confirmed that the $TiO_2$ amount is too much.

In the embodiment Nos. 48 and 52 corresponding to the eight-component system lacking $P_2O_5$, the high FF value of 78 was acquired in each case from $Sb_2O_5$ of 0.2 to 1.0 (mol %) when the other components were set identical to No. 51 or the like.

According to the evaluation result of the embodiments depicted in Table 1, when the glass frit having the composition within the ranges described above is used, the FF value exceeding 75 can be acquired even if a line width of the light-receiving surface electrode 20 is narrowed to about 100 (µm). According to the embodiments, since the Pb/Si mol ratio is set within the range of 0.5 to 1.70; $Li_2O$ is included within the range of 0.6 to 18.0 (mol %); and at least one of $P_2O_5$ and $Sb_2O_5$ is included within the range equal to or less than 6.0 (mol %) in the former case or within the range equal to or less than 4.0 (mol %) in the latter case, it is believed that the erosion amount at the time of fire-through is appropriately controlled, that the favorable ohmic contact is acquired, and that the high FF value and favorable leak current characteristics as described above are acquired.

According to the evaluation result described above, it is understood that the application to high-sheet-resistance cells is enabled by adding an appropriate amount of $P_2O_5$ or $Sb_2O_5$ instead of $Li_2O$. Since excessive Sb tends to raise the softening point of glass and increase the contact resistance, the FF value is likely to be lower. Excessive P tends to lower the current value and it is inferred that this is the effect of a surface recombination rate due to the generation of a dead layer. These are general tendencies of the components and, if amounts of other components are defined within preferable ranges in multicomponent glass, the effects of these components prominently appear and, therefore, the effect of excessive Sb as described above is not clear in Tables 1 and 2. According to the evaluation result, Nos. 6, 7, 17, 23, 24, 33, 37, 42 to 56, 63, 64, and 67 to 69 are considered to be optimum compositions. Nos. 47 to 49 and 54 are particularly favorable and No. 49 is considered to be most preferred because of a wide firing temperature range.

Table 3 summarizes results of evaluation of the characteristics of the solar cell 10 with the light-receiving surface electrode 20 formed by preparing Ag powders having different average particle diameters within the range of 0.3 to 3.0 (µm) and changing the average particle diameter of the glass frit within the range of 0.3 to 4.0 (µm) to prepare pastes for electrodes. A to F in the Ag powder field indicate types of silver powders and the average particle diameters of A, B, C, D, E, and F are 3.0 (µm), 2.2 (µm), 1.6 (µm), 0.8 (µm), 0.5 (µm), and 0.3 (µm), respectively. The frit numbers in the glass field correspond to the sample numbers described in Tables 1 and 2. The numbers in the leftmost field represent combinations of Ag powder types and frit numbers. The same combinations having different average particle diameters of glass are differentiated by branch numbers. Unless otherwise described, the conditions are the same as the evaluation described in Tables 1 and 2.

TABLE 3

PREPARED Ag PASTE AND ITS CHARACTERISTICS

| | Ag POWDER | | GLASS | | PREPARATION (wt %) | | | | |
| --- | --- | --- | --- | --- | --- | --- | --- | --- | --- |
| | PARTICLE | Ag POWDER | PARTICLE | FRIT | | | | | |
| No. | DIAMETER (μm) | No. | DIAMETER (μm) | No. | Ag POWDER | GLASS | VEHICLE | SOLVENT | FF(%) |
| A49 | 3.0 | A | 1.5 | 49 | 83 | 4 | 8 | 5 | >75 |
| B49 | 2.2 | B | 1.5 | 49 | 83 | 4 | 8 | 5 | >75 |
| C49 | 1.6 | C | 1.5 | 49 | 83 | 4 | 8 | 5 | >75 |
| D49 | 0.8 | D | 1.5 | 49 | 83 | 4 | 8 | 5 | >75 |
| E49 | 0.5 | E | 1.5 | 49 | 83 | 4 | 8 | 5 | >75 |
| F49 | 0.3 | F | 1.5 | 49 | 83 | 4 | 8 | 5 | >75 |
| C49-1 | 1.6 | C | 0.8 | 49 | 84 | 3 | 8 | 5 | >75 |
| C49-2 | 1.6 | C | 3.0 | 49 | 83 | 5 | 8 | 4 | >75 |
| C47-1 | 1.6 | C | 0.5 | 47 | 88 | 1 | 7 | 5 | >75 |
| C50-1 | 1.6 | C | 1.5 | 50 | 77 | 6 | 14 | 3 | >75 |
| C6 | 1.6 | C | 1.5 | 6 | 80 | 4 | 13 | 3 | >75 |
| F7 | 0.3 | F | 0.5 | 7 | 83 | 4 | 8 | 5 | >75 |
| C49-3 | 1.6 | C | 0.3 | 49 | 88 | 1 | 7 | 5 | >75 |
| C49-4 | 1.6 | C | 4.0 | 49 | 83 | 5 | 8 | 4 | 70 |

As described in the evaluation result, the FF value exceeding 75 was obtained in the samples A49 to F49 using the fit No. 49 in the entire Ag powder particle diameter range of 0.3 to 3.0 (μm) without particular change in preparation specifications. The particle diameter of Ag powder is not particularly limited at least to the extent of the evaluation and any diameter within 0.3 to 3.0 (μm) may be used.

Although the type and particle diameter of glass frit were variously changed in the samples C49-1 to C49-4 using the Ag powder C, the FF value exceeding 75 was obtained when any of the glass frit Nos. 49, 50, 6, and 7 were used. C49-1 and C49-2 had the same glass composition and the particle diameter of 0.8 (μm) and 3.0 (μm) and favorable results were acquired in each case from substantially the same specifications except that an amount of glass is slightly changed. Although C50-1 and C6 had an amount of vehicle increased to adjust the viscosity, the light-receiving surface electrode 20 could be formed with a line width of 100 (μm) as is the case with the other samples and the FF value exceeding 75 could be obtained. C49-3 produced a favorable result even if an amount of glass was 1 (wt %). Since a glass composition including a large amount of, for example, 12.0 (mol %), $Li_2O$ increases the erodibility, it is believed that a favorable ohmic contact can be acquired along with low line resistance even if an amount of glass is small.

The sample F7 was formed by changing only the glass frit as compared to the sample F49 and a favorable result could be acquired in each case without changing the other specifications. Therefore, an effect of difference in glass type was not particularly recognized.

C49-3 and C49-4 were for confirmation of the upper and lower limit values of the glass particle diameter and, if the frit No. 49 was crushed and used at the average particle diameter of 0.3 (μm), the FF value exceeding 75 was obtained when the preparation amount was 1 (wt %). On the other hand, if the frit No. 49 was crushed at 4.0 (μm), the FF value was limited to about 70 even when the preparation amount was 5 (wt %).

According to the result, the particle diameter of Ag powder is not particularly limited, and the glass type is not particularly limited provided that the glass type falls within the range of the embodiments described in Tables 1 and 2; however, the average particle diameter is preferably equal to or less than 3.0 (μm).

Although the present invention has been described in detail with reference to the drawings, the present invention may also be implemented in different forms and may variously be modified within a range not departing from the spirit thereof.

Description of Reference Numerals

10: solar cell 12: silicon substrate 14: n layer 16: p⁺ layer 18: antireflection film 20: light-receiving surface electrode 22: rear surface electrode 24: light-receiving surface 26: entire surface electrode 28: belt-like electrode

The invention claimed is:

1. A conductive paste composition for a solar cell comprising a conductive powder, a glass frit, and a vehicle,
the glass frit consisting of glass containing 0.6 to 18.0 mol % $Li_2O$, at least one of 0.1 to 6.0 mol % $P_2O_5$ and 0.1 to 4.0 mol % $Sb_2O_5$, 30 to 62 mol % PbO, more than 3 to 18 mol % $B_2O_3$, 18 to 65 mol % $SiO_2$, 0 to 6 mol % $Al_2O_3$, 0 to 6 mol % $TiO_2$, and 0 to 30 mol % ZnO in oxide conversion, the glass having a ratio of Pb/Si within a range of 0.5 to 1.7.

2. The conductive paste composition for a solar cell of claim 1, wherein the glass contains 3.0 to 12.0 mol % $Li_2O$, at least one of 0.1 to 4.0 mol % $P_2O_5$ and 0.1 to 2.0 mol % $Sb_2O_5$, 30 to 50 mol % PbO, more than 3 to 13 mol % $B_2O_3$, 20 to 45 mol % $SiO_2$, 0 to 6 mol % $Al_2O_3$, 0 to 6 mol % $TiO_2$, and 0 to 30 mol % ZnO, and has a mol ratio of Pb/Si within the range of 0.5 to 1.7.

3. The conductive paste composition for a solar cell of claim 1, wherein the glass contains 6.0 to 12.0 mol % $Li_2O$, at least one of 0.5 to 2.0 mol % $P_2O_5$ and 0.2 to 1.5 mol % $Sb_2O_5$, 30 to 50 mol % PbO, more than 3 to 9 mol % $B_2O_3$, 25 to 40 mol % $SiO_2$, 0 to 6 mol % $Al_2O_3$, 0 to 6 mol % $TiO_2$, and 0 to 30 mol % ZnO, and has a mol ratio of Pb/Si within the range of 0.5 to 1.7.

* * * * *